United States Patent
Marak et al.

(10) Patent No.: US 7,446,565 B2
(45) Date of Patent: Nov. 4, 2008

(54) APPARATUS AND METHOD THAT PROVIDES ACTIVE PULL-UP AND LOGIC TRANSLATION FROM ONE SIGNAL MODE TO ANOTHER SIGNAL MODE

(75) Inventors: Chadwick N. Marak, San Jose, CA (US); Jeffrey C Dunnihoo, Bertram, TX (US)

(73) Assignee: California Micro Devices, Milpitas, CA (US)

( * ) Notice: Subject to any disclaimer, the term of this patent is extended or adjusted under 35 U.S.C. 154(b) by 41 days.

(21) Appl. No.: 11/424,533

(22) Filed: Jun. 15, 2006

(65) Prior Publication Data
US 2008/0007302 A1    Jan. 10, 2008

(51) Int. Cl.
*H03K 19/094* (2006.01)
(52) U.S. Cl. .............................. 326/68; 326/80; 326/81
(58) Field of Classification Search .................. 326/63, 326/68, 80–81; 327/333
See application file for complete search history.

(56) References Cited

U.S. PATENT DOCUMENTS

| | | | |
|---|---|---|---|
| 4,701,720 A | 10/1987 | Monticelli et al. | |
| 5,084,637 A * | 1/1992 | Gregor | 326/81 |
| 5,517,135 A | 5/1996 | Young | |
| 5,656,950 A | 8/1997 | Duong | |
| 5,689,196 A * | 11/1997 | Schutte | 326/86 |
| 5,877,634 A | 3/1999 | Hunley | |
| 6,052,325 A | 4/2000 | Merritt | |
| 6,323,722 B1 | 11/2001 | Proebsting | |
| 6,329,839 B1 | 12/2001 | Pani et al. | |
| 6,492,686 B1 | 12/2002 | Pappert et al. | |
| 6,597,197 B1 | 7/2003 | Mosley et al. | |
| 6,781,415 B2 * | 8/2004 | Clark et al. | 326/81 |
| 7,161,386 B2 * | 1/2007 | Takiba et al. | 326/68 |
| 7,239,174 B2 | 7/2007 | Madurawe | |
| 2005/0162191 A1 | 7/2005 | Vorenkamp | |
| 2006/0044011 A1 | 3/2006 | Andresen et al. | |

OTHER PUBLICATIONS

International Search Report issued Feb. 15, 2008 in corresponding PCT/US2007/013034.
International Search Report issued in corresponding PCT/US2007/12884.

* cited by examiner

*Primary Examiner*—Anh Q Tran
(74) *Attorney, Agent, or Firm*—Pillsbury Winthrop Shaw Pittman LLP

(57) ABSTRACT

Described is an integrated circuit that causes an input signal having one signal mode with a high state, a low state and a transition state to be dynamically level shifted to another signal mode with a respective high and low state, while minimizing a duration of the transition state of the output signal, wherein the one signal mode and the another signal mode have respectively different high and low state levels.

11 Claims, 3 Drawing Sheets

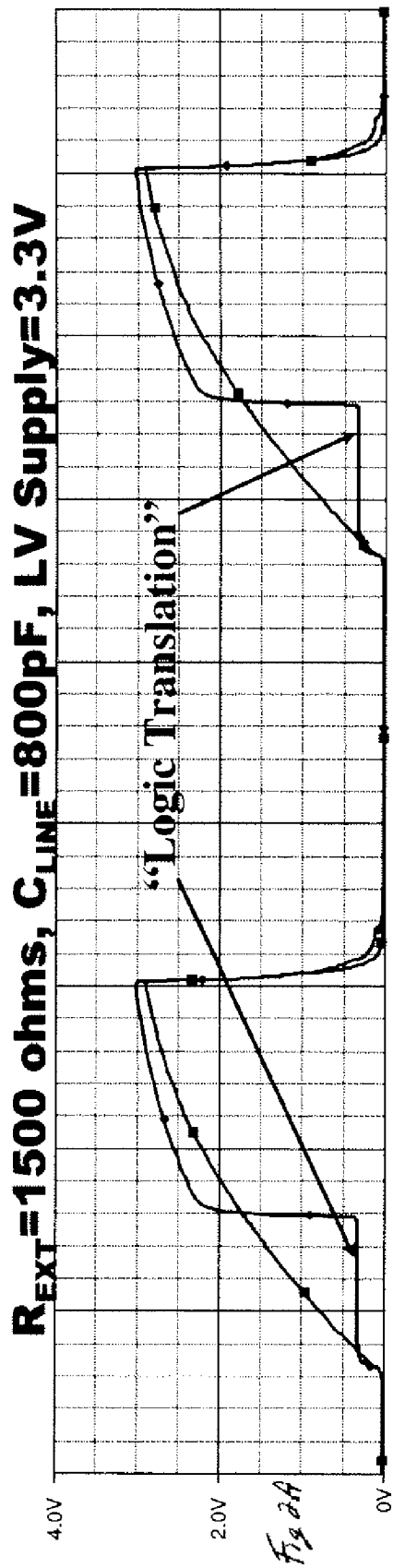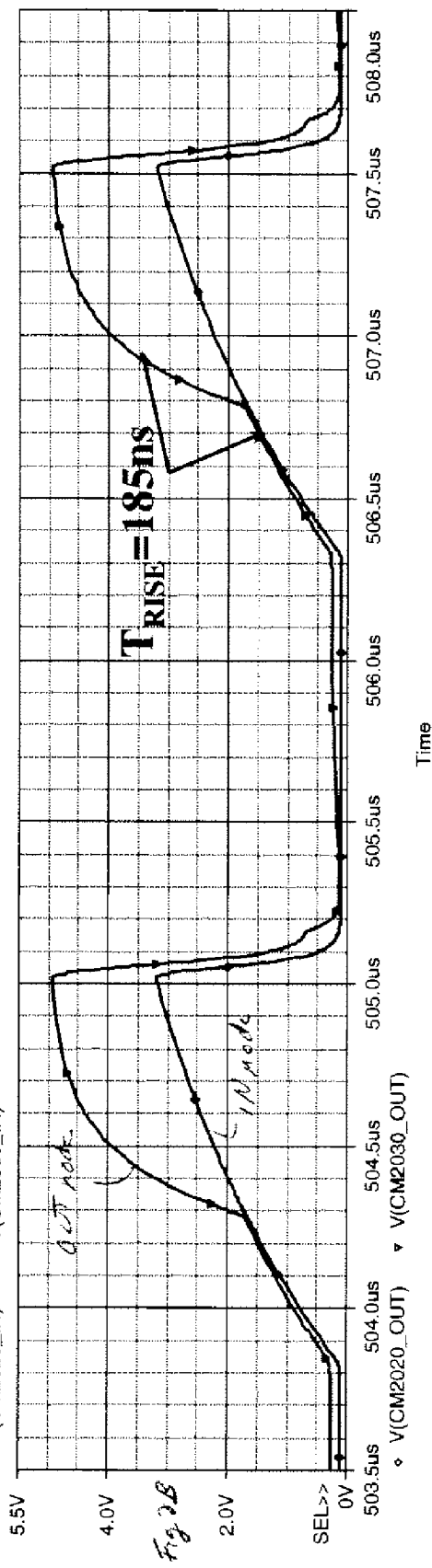

APPARATUS AND METHOD THAT PROVIDES ACTIVE PULL-UP AND LOGIC TRANSLATION FROM ONE SIGNAL MODE TO ANOTHER SIGNAL MODE

FIELD OF THE INVENTION

The present invention provides an apparatus and method that provides active pull-up and logic translation from one signal mode to another signal mode, and, more particularly from a CMOS signal mode to an I2C signal mode.

BACKGROUND OF THE INVENTION

Circuits that provide level shifting from one signal mode to another signal mode are known. Circuits that provide an active pull-up function or an active pull-down function on an input signal are also known. An example of the latter type of circuit is the Linear TechnologyLTC1694, which provides active pull-up using a multiple discreet components.

Providing these functions together, however, has not been needed, and such is particularly true with respect to applications where these functions operate on the same signal on the same bus. It has been found, however, that providing these functions together on a single bus has advantages, and that there are even further advantages to providing such functions on a single integrated circuit chip that is designed and fabricated using conventional techniques.

SUMMARY OF THE INVENTION

The present invention provides for both logic translation and dynamic level shifting of a signal that is transmitted on a single bus.

In one embodiment there is an integrated circuit that causes an input signal having one signal mode with a high state, a low state and a transition state to be dynamically level shifted to another signal mode with a respective high and low state, while minimizing a duration of the transition state of the output signal, wherein the one signal mode and the another signal mode have respectively different high and low state levels.

In a particular embodiment, the one signal mode is a CMOS mode and the another signal mode is an I2C mode, and the input signal is a 100 kHz signal.

There is also described a method of operating upon an input signal that is transmitted along a single bus to result in an output signal. The method includes the steps of translating the input signal from one signal mode with a high state, a low state and a transition state to an output signal having another signal mode with a respective high and low state; and minimizing a duration of the transition state of the output signal, wherein the one signal mode and the another signal mode have respectively different high and low state levels.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 2A and 2B illustrate signal waveforms related to the active pull-up/logic translation circuit according to the present invention.

DETAILED DESCRIPTION OF THE PREFERRED EMBODIMENTS

Figure 1:
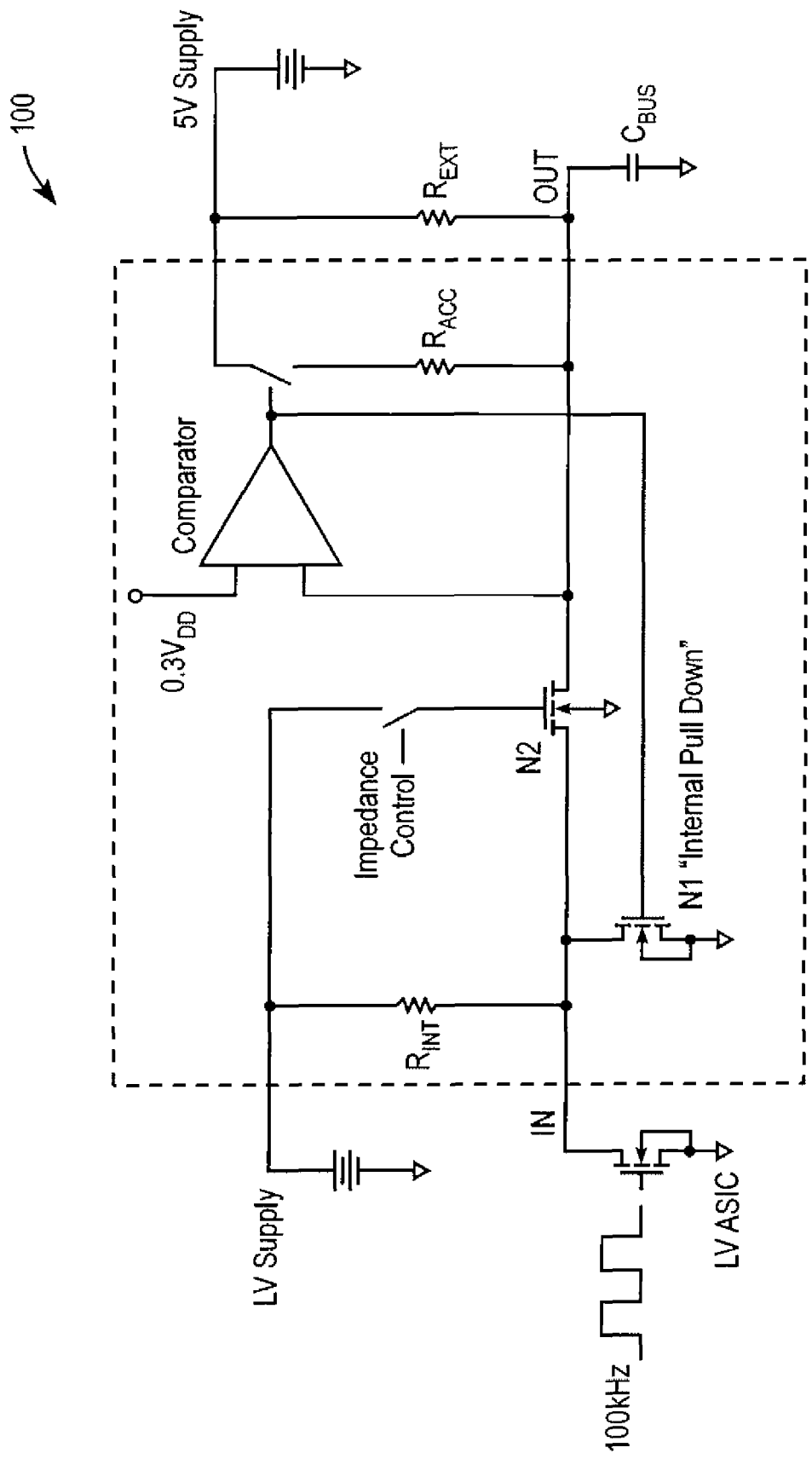
FIG. 1 illustrates a block diagram of the active pull-up/logic translation circuit according to the present invention.

FIG. 1 illustrates the active pull-up/logic translation circuit 100 according to the present invention. It is preferably integrated onto a single chip, and can have functions other than those described by the present invention disposed therein. In this preferred embodiment the invention is described with reference to the HDMI specification and the CMOS to I2C translation that is in many instances required thereby. While so described, the present invention is not limited by this embodiment.

The invention comes, however, from recognition of certain requirements of the HDMI specification. In particular, the HDMI spec states that the bus capacitance cannot exceed 800 pF which is broken down as follows:

50 pF from a source (i.e. DVD player)
50 pF from a sink (i.e. TV)
700 pF from a HDMI cable HDMI cables that meet the cable specification rating are typically very expensive due to their having such a low capacitance. Given this expense, the present invention allows for the use of less expensive HDMI cables where the capacitance exceeds 700 pF. The active pull-up circuit in the present invention, as described hereinafter, meets all I2C protocol risetimes for the "standard mode" speed of 100 kHz which HDMI uses for a cable having a capacitance of approximately 4000 pF. While this allows for cheaper cable, it also allow for longer cables (i.e. on the order of 100 feet (31 m) rather than 50 ft (15 m)

Further, the rise/fall times that the present invention meets are rise time of 1000 ns and fall time of 300 ns. The present invention, as described herein, implements a 1-to-1 effect on the rise time through the active pull-up as described herein. The fall time is controlled by the external field effect transistor LV ASIC while the "OUT" node signal is 5V-1.5V and then the present invention assists with pull-down when the "OUT" node signal is going from 1.5V-0V.

This circuit 100 has two overall functions. One overall function is to accelerate the LOW→HIGH transition on the "OUT" node for high capacitance loads. The other is to keep the "IN" node at a first signal mode "LOW" level while the "OUT" node is at a second signal mode "LOW" level, where second signal mode is different from the first signal mode.

With respect to the overall function of accelerating signal transition, an external resistor REXT is defined by the HDMI specification to provide first overall function, but unfortunately the value of REXT is too "large" to pull up the "OUT" node in the specified time for high capacitive loads. The REXT cannot be made smaller because the external field effect transistor LV ASIC (which also provide a buffer function) that is controlling the bus is only rated to sink X mA continuously, which is the current that will flow through Rext when "OUT" is at GND. Given this, the HDMI specification mandates that REXT have a MIN value of 1.5 kohms and MAX value of 2 kohms.

With respect to the second overall function of maintaining signal mode levels maintained, in particular for the HDMI embodiment this function can be described as keeping the "IN" node at a CMOS "LOW" level while the "OUT" node is an I2C "LOW" level. (I2C "LOW"=0-1.5V & CMOS "LOW"=0-0.8V)

A preferred embodiment of the present invention is described herein in the context of a 100 kHz signal that is described by the HDMI specification. How the present invention operates when the 100 kHz Signal is in the high state, and then in the low state, will be next described.

The active pull-up/logic translation circuit 100 is comprised of a signal mode transition circuit that is labeled "Impedance Control," a pull-up circuit that is comprised of the comparator and associated components, and a pull-down circuit illustrated at pull-down transistor N1. The CBUS has an "IN" node and an "OUT" node, which bus has disposed thereon the pass transistor N2.

The Impedance Control circuit, in conjunction with RINT as described hereinafter, operates to keep the "IN" node at a first signal mode "LOW" level while the "OUT" node is at a second signal mode "LOW" level.

100 kHz Signal is "HIGH". When the 100 kHz signal transitions to "HIGH" the field effect transistor LV ASIC has control of the entire bus CBUS (including both "IN" and "OUT" nodes that are disposed on the active pull-up/logic translation circuit 100). The field effect transistor LV ASIC pulls both sides of the bus "LOW," which is typically less than 0.4V. During this state the Impedance Control block sets the gate of transistor N2 to just above a transistor threshold and the comparator leaves the switch SW to RACC in the "OFF" position. Although the gate of transistor N1 is "HIGH" the field effect transistor LV ASIC dominates the bus and causes pulling of the "IN" node to be "LOW," as well as the "OUT" node.

100 kHz Signal is "LOW". When the 100 kHz signal transitions to "LOW", the field effect transistor LV ASIC releases the bus CBUS so that the internal resistor RINT now pulls up the "IN" node, but the gate of transistor NI is still "HIGH" so the "IN" node remains below 0.8V. At the same time, the external resistor REXT pulls up the "OUT" node. Also during this same time the "Impedance Control" circuit still has the gate of N2 just above a threshold, nearly isolating both sides of the bus. Then, as soon as the "OUT" node reaches 1.5V or 0.3VCC, the gate of transistor N1 goes "LOW" releasing the "IN" node to go "HIGH" via internal resistor RINT and the "Impedance Control" circuit returns control of transistor N2 to the LV Supply. Additionally, the comparator turns ON the switch to RACC and the "OUT" rises quickly.

FIGS. 2A and 2B illustrate signal waveforms related to the active pull-up/logic translation circuit according to the present invention, as compared to a standard circuit using a resistor REXT. As illustrated, FIG. 2B advantageously illustrates that the rise time to the high state output signal is much quicker than a conventional circuit.

Figure 3:
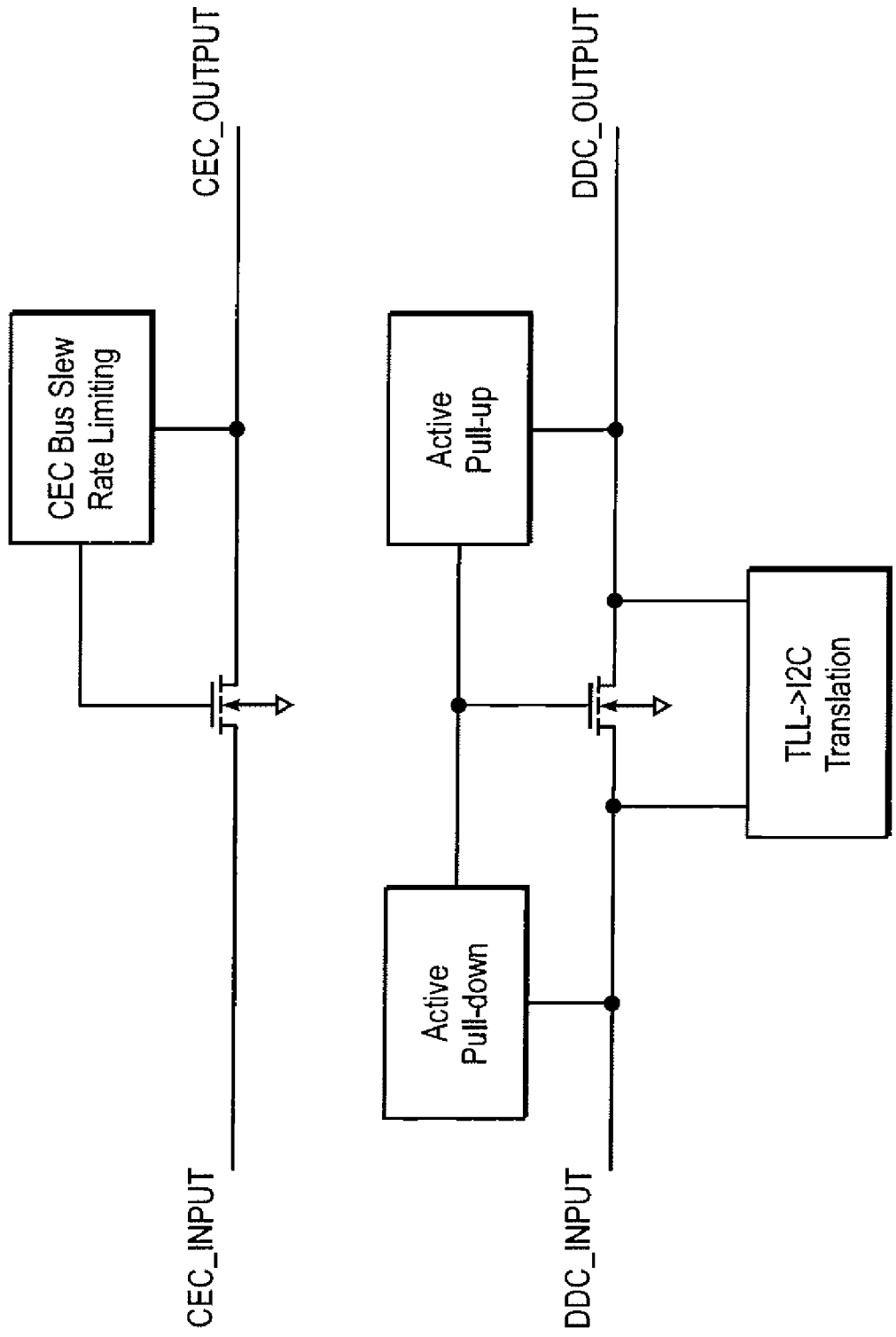
FIG. 3 illustrates a block diagram of a circuit that provides functionality as described by the invention described herein as well as slew rate control described by an invention that is incorporated by reference herein.

FIG. 3 illustrates a block diagram of a circuit that provides functionality as described by the invention described herein as well as slew rate control described by U.S. patent application filed today with the title "BIDIRECTIONAL BUFFER WITH SLEW RATE CONTROL AND METHOD OF BIDIRECTIONALLY TRANSMITTING SIGNALS WITH SLEW RATE CONTROL" and bearing the attorney reference 010549-0317731, the contents of which are expressly incorporated by reference herein, and to which priority is also claimed. The functions of the various blocks illustrated are fully described in this application and in the other application.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. A circuit connected between a supply voltage and ground that operates upon an input signal to generate an output signal comprising:
   an input node;
   an output node;
   a signal path disposed between the input node and the output node, whereby the input node, the output node and the signal path are part of a common bus;
   a pass transistor disposed within the signal path;
   an impedance control circuit coupled to the input node and which controls the pass transistor;
   a comparator that compares a voltage on the output node to a reference voltage, and produces a comparator output signal on a comparator output line;
   a pull-down transistor coupled between the input node and the ground, and being controlled by the comparator output signal on the comparator output line;
   a switch coupled to the supply voltage, and controlled by the comparator signal; and wherein:
   the pass transistor, and the impedance control circuit together operate to cause the input signal having one signal mode with a high and a low state on the input node to be level shifted to the output signal having another signal mode with a respective high and low state on the output node; and
   the comparator, the pull-down transistor and the switch together operate to cause dynamic pull-up and pull-down of the level shifted output signal.

2. The circuit according to claim 1 wherein the input node, the output node, the signal path, the pass transistor, the comparator the pull-down transistor and the switch are formed on a single integrated circuit.

3. The circuit according to claim 2 wherein the one signal mode is a CMOS mode and the another signal mode is an I2C mode.

4. The circuit according to claim 3 wherein the input signal is a 100 kHz signal.

5. A circuit connected between a supply voltage and ground comprising:
   an input node;
   an output node; and
   means for causing an input signal having one signal mode with a high state, a low state and a transition state to be dynamically level shifted to another signal mode with a respective high and low state, while minimizing a duration of the transition state of the output signal, wherein the one signal mode and the another signal mode have respectively different high and low state levels, wherein the means for causing the input signal to be dynamically shifted includes a comparator means for causing dynamic pull up and pull down of the output signal.

6. The circuit according to claim 5 wherein the input node, the output node, and the means for causing are formed on a single integrated circuit.

7. The circuit according to claim 6 wherein the one signal mode is a CMOS mode and the another signal mode is an I2C mode.

8. The circuit according to claim 7 wherein the input signal is a 100 kHz signal.

9. A method of operating upon an input signal that is transmitted along a single bus to result in an output signal comprising the steps of:

translating the input signal from one signal mode with a high state, a low state and a transition state to an output signal having another signal mode with a respective high and low state; and minimizing a duration of the transition state of the output signal, wherein the one signal mode and the another signal mode have respectively different high and low state levels, wherein the translating step includes maintaining the input signal at the one signal mode low state and the output signal at the another signal mode low state using an impedance control circuit, and wherein translating the input signal includes controlling a pass transistor disposed on a signal path disposed between the input and output signals.

10. A method of operating upon an input signal that is transmitted along a single bus to result in an output signal comprising the steps of:

translating the input signal from one signal mode with a high state, a low state and a transition state to an output signal having another signal mode with a respective high and low state; and minimizing a duration of the transition state of the output signal, wherein the one signal mode and the another signal mode have respectively different high and low state levels, wherein the translating step includes maintaining the input signal at the one signal mode low state while and the output signal at the another signal mode low state using an impedance control circuit, and wherein minimizing the duration of the transition state includes controlling dynamic pull-up and pull-down of the output signal using a comparator to control pull-up and pull-down transistors.

11. The circuit according to claim 6, wherein the means for causing the input signal to be dynamically shifted includes an impedance control means for maintaining the input signal at the one signal mode "LOW" level while the output signal is at the another signal mode "LOW" level.

* * * * *